(12) United States Patent
Macris et al.

(10) Patent No.: US 7,554,190 B2
(45) Date of Patent: Jun. 30, 2009

(54) LIQUID METAL THERMAL INTERFACE MATERIAL SYSTEM

(76) Inventors: Chris Macris, P.O. Box 313, North Bend, WA (US) 98045; Thomas R. Sanderson, 25760 SE. 35 Pl, Issaquah, WA (US) 98029; Robert G. Ebel, 10714 Interlake Ave. North, Seattle, WA (US) 98133

( * ) Notice: Subject to any disclaimer, the term of this patent is extended or adjusted under 35 U.S.C. 154(b) by 360 days.

(21) Appl. No.: 11/248,720

(22) Filed: Oct. 11, 2005

(65) Prior Publication Data
US 2006/0118925 A1 Jun. 8, 2006

Related U.S. Application Data

(63) Continuation-in-part of application No. 11/004,017, filed on Dec. 3, 2004.

(51) Int. Cl.
*H01L 23/10* (2006.01)
*H01L 23/34* (2006.01)

(52) U.S. Cl. ............... 257/706; 257/707; 257/E23.101; 257/E23.102; 257/E23.109

(58) Field of Classification Search ................ 257/706, 257/707, E23.101, E23.102, E23.109
See application file for complete search history.

(56) References Cited

U.S. PATENT DOCUMENTS

| | | | |
|---|---|---|---|
| 4,915,167 A | 4/1990 | Altoz | |
| 5,323,294 A | 6/1994 | Layton et al. | |
| 5,561,590 A | 10/1996 | Norell et al. | |
| 5,572,404 A | 11/1996 | Layton et al. | |
| 5,729,052 A * | 3/1998 | Tonti et al. | 257/712 |
| 5,770,478 A * | 6/1998 | Iruvanti et al. | 438/122 |
| 5,773,362 A * | 6/1998 | Tonti et al. | 438/665 |
| 5,825,087 A * | 10/1998 | Iruvanti et al. | 257/707 |
| 5,909,056 A | 6/1999 | Mertol | |
| 6,016,006 A | 1/2000 | Kolman et al. | |
| 6,037,658 A | 3/2000 | Brodsky et al. | |
| 6,097,602 A | 8/2000 | Witchger | |
| 6,275,381 B1 * | 8/2001 | Edwards et al. | 361/717 |
| 6,281,573 B1 | 8/2001 | Atwood et al. | |
| 6,292,362 B1 | 9/2001 | O'Neal et al. | |
| 6,372,997 B1 | 4/2002 | Hill et al. | |
| 6,391,442 B1 * | 5/2002 | Duvall et al. | 428/348 |
| 6,444,496 B1 * | 9/2002 | Edwards et al. | 438/122 |
| 6,617,517 B2 | 9/2003 | Hill et al. | |
| 6,656,770 B2 | 12/2003 | Atwood et al. | |
| 6,665,186 B1 | 12/2003 | Calmidi et al. | |
| 6,761,928 B2 | 7/2004 | Hill et al. | |
| 6,764,759 B2 * | 7/2004 | Duvall et al. | 428/348 |
| 6,849,941 B1 | 2/2005 | Hill et al. | |
| 6,891,259 B2 | 5/2005 | Im et al. | |
| 6,940,721 B2 | 9/2005 | Hill | |
| 2003/0085475 A1 | 5/2003 | Im et al. | |
| 2003/0173051 A1 | 9/2003 | Rinella et al. | |
| 2003/0183909 A1 | 10/2003 | Chiu | |
| 2004/0262766 A1 | 12/2004 | Houle | |
| 2005/0070048 A1 * | 3/2005 | Tolchinsky et al. | 438/108 |

(Continued)

*Primary Examiner*—Ngan Ngo
(74) *Attorney, Agent, or Firm*—Robert A. Jensen; Jensen & Puntigam, P.S.

(57) ABSTRACT

A metal thermal interface structure for dissipating heat from electronic components comprised a heat spreader lid, metal alloy that is liquid over the operating temperature range of the electronic component, and design features to promote long-term reliability and high thermal performance.

72 Claims, 9 Drawing Sheets

U.S. PATENT DOCUMENTS

2005/0073816 A1    4/2005  Hill et al.
2006/0138644 A1*   6/2006  Houle et al. ................ 257/706
2006/0141671 A1*   6/2006  Houle et al. ................ 438/122
2007/0164424 A1*   7/2007  Dean et al. .................. 257/707

* cited by examiner

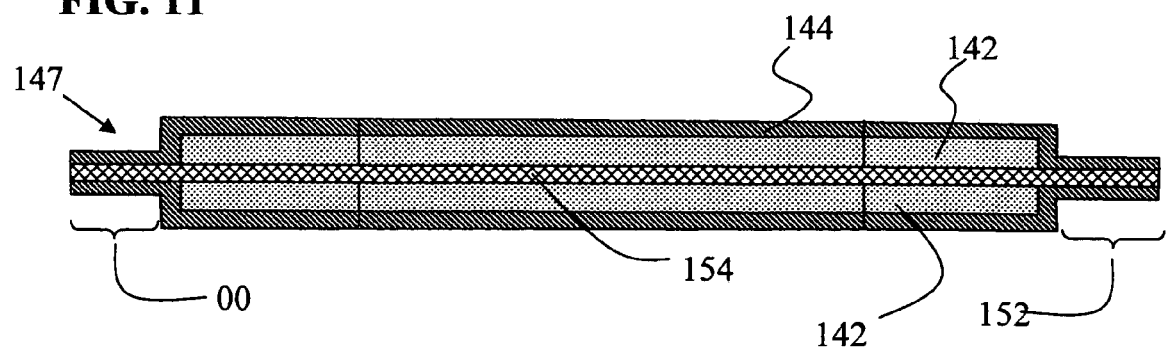
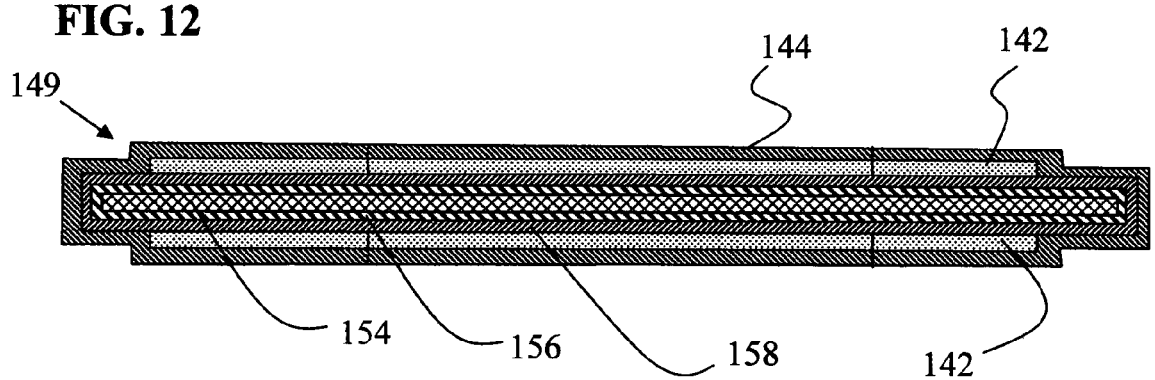
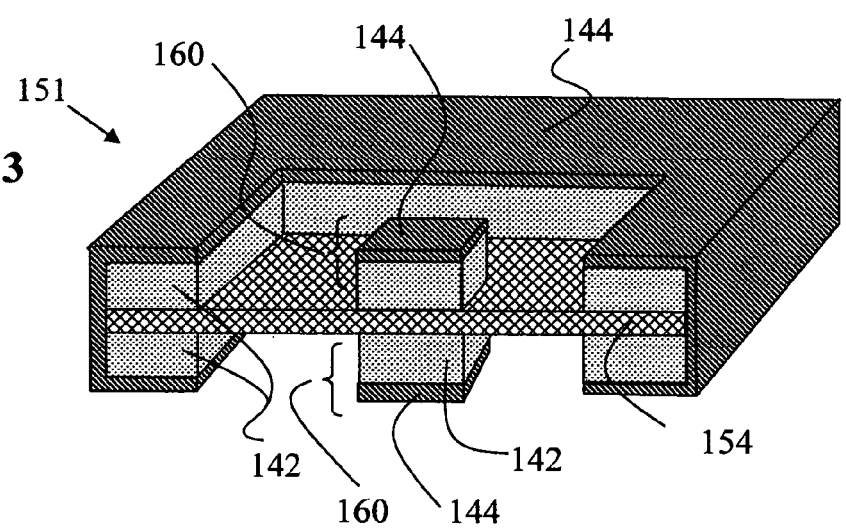

LIQUID METAL THERMAL INTERFACE MATERIAL SYSTEM

The present application is a continuation-in-part of, and claims priority from, U.S. patent application Ser. No. 11,004,017, filed Dec. 3, 2004, and still pending.

TECHNICAL FIELD

This invention relates to the field of heat transfer structures between electronic components and their associated heat exchangers and, more particularly, to a thermal interface system which utilizes a metal alloy interface, materials and design features to stabilize the alloy while exposed to various environmental conditions.

BACKGROUND OF THE INVENTION

Today's electronic components generate significant amounts of heat which must be removed to maintain the component's junction temperature within safe operating limits. Failure to effectively conduct away heat leaves these devices at high operating temperatures, resulting in decreased performance and reliability and ultimately failure.

The heat removal process involves heat conduction between the electronic component and heat exchanger, or heat sink, via a thermal interface material. Small irregularities and surface asperities on both the component and heat sink surfaces create air gaps and therefore increase the resistance to the flow of heat. The thermal resistance of the interface between these two surfaces can be reduced by providing an interface material which fills the air gaps and voids in the surfaces.

An ideal medium for transferring heat from one surface to another should have low interfacial or contact thermal resistance, high bulk thermal conductivity and the ability to achieve a minimum bond-line thickness. Additional desirable qualities include product stability, ease of deployment, product reworkability, low cost and non-toxicity.

Liquids have low interfacial resistance because they wet a surface forming a continuous contact with a large area. Most liquids do not, however, have very high conductivity. Solids, and in particular metals, have very high conductivity but high interfacial resistance. Most common heat transfer materials combine highly conductive particles with a liquid or plastic in order to exploit both characteristics. Examples of the former are greases and gels while the latter include filled epoxies, silicones and acrylics.

Greases have been developed with thermal conductivities significantly better than the corresponding conductivities of filled adhesives. Typical problems with greases include pumping and dry out, both of which can cause the conducting medium to lose contact with one or both of the heat transfer surfaces. Pumping occurs when the structure is deformed, due to differential thermal expansion or mechanical loads, and the grease is extruded. The oils contained in a grease can be depleted by evaporation or by separation and capillary flow.

Liquid metal alloys (liquid at the operating temperature of the electronic component), such as alloys of bismuth, gallium and indium, potentially offer both low interfacial resistance and high conductivity. Several alloys of gallium with very low melting points have also been identified as potential liquid metal interface materials. Thermal performance of such an interface would be more than one order of magnitude greater than many adhesives typically in use.

Although liquid metal alloys offer both low interfacial resistance and high conductivity, they have historically suffered from various reliability issues including corrosion/oxidation, intermetallic formation, drip-out, dewetting, and migration. Unless mitigated, these mechanisms will continue to degrade the interface, resulting in a thermally related catastrophic failure of the actual electronic component.

The ability to contain an electrically conductive liquid within an electronic package presents significant challenges. The liquid must be reliably retained in the thermal interface throughout the life of the package if shorting is to be avoided and effective resistance is to be minimized. To solve the problems of liquid metal migration, various seal and gasket mechanisms have been disclosed.

Although, these various mechanisms mitigate liquid metal migration, some disclosures include elastomeric or polymeric components in the thermal path which is thermally undesirable. Other disclosures include various seals which increase the bondline thickness (BLT) of the liquid metal, thereby, increasing the bulk thermal resistance of the interface. These elastomeric components are not hermetic and therefore do not prevent air or moisture from entering the thermal joint.

In addition, corrosion will propagate through the thermal interface should any air gaps be present. Surface asperities of the heat source and heat exchanger increase the potential for voids. This is further exacerbated when the metal changes between the liquid and the solid state within the temperature range of the package.

U.S. Pat. No. 5,323,294 and 5,572,404, granted to Layton, et al. on Jun. 21, 1994 and Nov. 5, 1996, respectively, and U.S. Pat. No. 5,561,590, granted to Norell, et al. on Oct. 1, 1996 disclose a heat transfer module in which a compliant, absorbent body containing liquid metal is surrounded by a seal, said body is spaced apart from the seal area. As the module is clamped between a heat source and heat exchanger, liquid metal is squeezed out of the porous structure to fully fill the space within the seal area.

U.S. Pat. No. 4,915,167, granted to Altoz, et al. on Apr. 10, 1990 discloses a low melting point thermal interface material which is contained between the heat source and heat exchanger by applying a sealant to completely encapsulate the exposed interface material.

U.S. Pat. Nos. 6,761,928, 6,617,517, 6,372,997, granted to Hill, et al. on Jul. 13, 2004, Sep. 9, 2003, and Apr. 16, 2002, respectively, and U.S. Pat. No. 6,940,721, granted to Hill on Sep. 6, 2005 disclose a low melting point alloy coating both sides of a surface enhanced metallic foil, thereby providing a carrier to support and contain the liquid metal alloy. The low melt alloy on the foil carrier, placed between a heat source and heat exchanger, will become molten during the operational temperatures of the heat source.

U.S. Pat. No. 6,849,941, granted to Hill, et al. on Feb. 1, 2005 discloses a liquid metal interface material in which the material is bonded (in solid form) to a solid base member and includes a sealing material set into a annular groove (within the base member) surrounding the periphery of the bonded interface.

U.S. Pat. No. 6,037,658, granted to Brodsky, et al. on Mar. 14, 2000 discloses a heat transfer surface in which a thermally conductive fluid is contained by both an absorbent medium and a seal to inhibit migration.

U.S. Pat. No. 6,016,006, granted to Kolman, et al. on Jan. 18, 2000 discloses a method for applying thermal interface grease between an integrated circuit device and a cover plate in which a seal encloses the region of the device. Thermal grease is injected into the cavity region via an inlet port in the cover plate thereby filling the interface between device and plate.

U.S. Pat. No. 5,909,056, granted to Mertol on Jun. 1, 1999 discloses a thermal interface structure in which a phase change thermal interface material is contained within a protrusion on a heat spreader and a dam ring, which is attached to the backside of a semiconductor chip.

U.S. Pat. No. 6,891,259, granted to Im, et al. on May 10, 2005 and U.S. patent application No. 20030085475, filed by Im, et al. on Oct. 10, 2002 disclose a semiconductor package in which a dam substantially surrounds the thermal interface material. The package lid includes injection holes for the dispensation of the dam and interface material.

U.S. Pat. No. 6,292,362, granted to O'Neal, et al. on Sep. 18, 2001 discloses a thermal interface material module in which a flowable interface material is deposited in the center opening of a picture-frame carrier and a gasket is mounted to the carrier. With the application of heat, the reservoir area between the interface material and gasket is filled.

U.S. Pat. No. 6,097,602, granted to Witchger on Aug. 1, 2000 discloses a thermal interface structure in which a phase change interface material is surrounded by a fabric carrier dike structure. The dike is adhesively attached to both the electronic circuit package and heat sink, thereby preventing interface material from migrating from the joint.

U.S. Pat. Nos. 6,281,573 and 6,656,770, granted to Atwood, et al. on Aug. 28, 2001 and Dec. 2, 2003, respectively, disclose both a solder-based seal (between the ceramic cap/heat exchanger and package substrate) and an elastomeric gasket (between the ceramic cap/heat exchanger and chip) to "near hermetically" seal the cavity containing a Gallium alloy liquid metal interface material and thereby limit oxidation and migration.

U.S. Pat. No. 6,665,186, granted to Calmidi, et al. on Dec. 16, 2003 discloses a liquid metal interface material held in place by a flexible seal, such as an O-ring, which also accommodates expansion and contraction of the liquid. The seal also allows for air venting and filling of liquid metal.

U.S. patent application No. 20030173051, filed by Rinella, et al. on Mar. 12, 2002 discloses a method of forming a thermal interface in which a semi-solid metal, injected through an inlet on a heat spreader plate, fills the gap between a die and the cavity formed in the heat spreader plate.

U.S. patent application No. 20030183909, filed by Chiu on Mar. 27, 2002 discloses a method of forming a thermal interface in which a thermal interface material is dispensed through and inlet in a heat spreader in order to fill the interface between the spreader and the chip.

U.S. patent application No. 20040262766, filed by Houle on Jun. 27, 2003 discloses a liquid metal interface contained within a cold-formed o-ring barrier positioned directly on the chip. Once the barrier is established between the heat spreader and chip, liquid metal is introduced into the interface via a channel in the spreader.

U.S. patent application No. 20050073816, filed by Hill on Jan. 7, 2004 discloses a liquid metal interface assembly in which an o-ring or shim sealing member surrounds the liquid metal interface material to shield the interface from the atmosphere.

FIGS. 1 through 3 show various methods of forming a void-free, high thermal performance thermal interface within electronic assemblies 100. FIG. 1A illustrates an electronic assembly 100 comprised of a thermal interface structure 102 positioned between a heat spreader lid 104 and electronic component 106, which is comprised of an IC chip 108, package substrate 110 and electrical interconnection vias 112. The interface structure 102 is comprised of a metallic core 120 encapsulated by a metallic interface composition 122. An adhesive layer 114 bonds the heat spreader lid 104 to the electronic component package substrate 110. It can be seen in FIG. 1B that the lid 104 has now been mounted to the package substrate 110 with an adhesive layer 114 located on the lid flange 116. During operation of the electronic component 106, the resultant heat will cause excess metallic interface composition 122 to flow out of the thermal interface, thereby creating a fillet 118 outside the IC chip perimeter. Unfortunately, oxidation, present on the surface of the metallic interface 122 prior to heating and flowing, creates a "skin" and prohibits filling of the surface asperities present on the lid 104 and IC chip 108. FIG. 1c, a magnified sectional view of FIGS. 1a and 1b, illustrates the resultant air gaps 123 due to the layer of oxidation 125 inhibiting flow of interface material. The non-hermetic interface allows oxygen and moisture to penetrate into these air gaps 123 and continue oxidation/corrosion of the metallic interface composition 122 within the interface between chip 108 and lid 104.

Within FIG. 2, it can be seen that a metallic thermal interface composition is injected (by a dispenser 124) through a hole 126 in the heat spreader lid 104 to yield a filled thermal interface joint 128. Without a barrier or seal, interface material would have the tendency to migrate out of the joint. The use of a seal will promote full filling of the thermal joint as well. Additionally, the hole 126, filled with the interface composition would certainly possess lower thermal conductivity than the typical materials (copper, aluminum) comprising heat spreader lids.

FIG. 3, similar to FIG. 2, illustrates an electronic assembly 100 comprised of a thermal interface structure 130 sandwiched between an IC chip 108 and heat spreader lid 104. The lid 104 includes at least one gas permeable plug 132 located within holes 134 in the lid 104. A barrier or seal 136 is placed near the perimeter of the IC chip 108, thereby creating a seal and space between the lid 104 and IC chip 108. Liquid interface material 138 is injected into the holes 134 in the lid 104, thereby filling the space comprising the thermal interface joint. Should the barrier be of polymeric composition, heat transfer would be reduced near the perimeter of the chip. A metallic barrier would require a bonding and hermetic seal in order for the gas permeable plugs to be effective. Barrier bonding may induce unwanted stresses between the IC chip 108 and the lid 104. Additionally, the holes 134 in the lid would also created undesirable thermal impedance between the chip 108 and lid 104.

SUMMARY OF THE INVENTION

Accordingly, it is the overall feature of the present invention to provide an improved thermal interface system in order to more effectively transfer thermal energy from an electronic component to a heat exchange structure.

An additional feature of the present invention is to provide an improved metal thermal interface system which is liquid over the operating temperature of the electronic component, thereby minimizing the stresses placed on the electronic component by the heat exchange structure.

Yet, another feature of the present invention is to provide a corrosion resistant interface system in which the metallic interface composition flows and fills the surface asperities on both the electronic component and heat exchanger thereby sealing the interface from moisture and oxygen.

A further feature of the present invention is to provide an improved metal thermal interface system which includes materials and design features, such as moisture seals, encapsulants, desiccants and corrosion inhibitors, to promote long-term stability and reliability by mitigating corrosion.

Still another feature of the present invention is to provide an improved metal thermal interface system which includes barrier structures to preclude metal interface migration and preserve high heat transfer.

One additional feature of the present invention is to provide a metallic interface composition including oxygen gettering elements to promote wetting to oxide layers present on the surface of the electronic component chip and heat exchanger.

Lastly, it is a feature of the present invention to combine all of these unique design aspects and individual fabrication techniques into effective and manufacturable thermal interface system for electronic components, including Flip Chip integrated circuit (IC) packages.

BRIEF DESCRIPTION OF THE DRAWINGS

FIGS. 4a through 4d, sectional views, illustrate the sequence of flowing, filling, and sealing of metallic interface material within a thermal interface joint of the present invention.

FIG. 11, a sectional view, illustrates another solid metallic core embodiment of the present invention.

FIG. 12, a sectional view, illustrates diffusion and wetting layers deposited on the metallic core in the present invention.

FIG. 13, an isometric view, illustrates an embodiment of the present invention in which an additional metallic interface composition island is added within the inner perimeter of the metallic seal.

DETAILED DESCRIPTION OF THE INVENTION

Figure 1A:
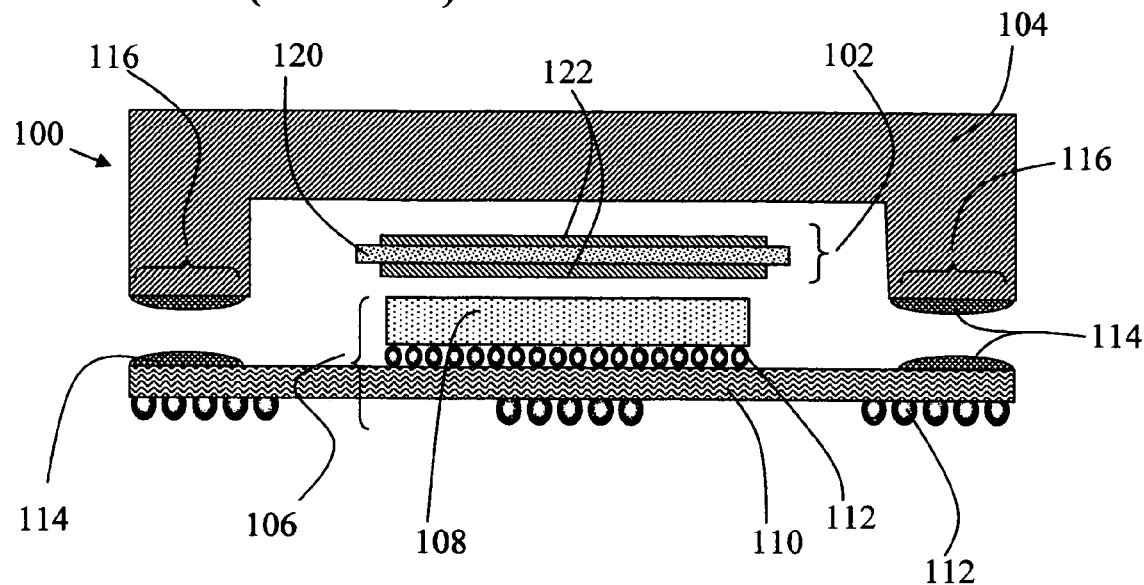
FIGS. 1a through 1c, sectional views, illustrate an electronic assembly including a foil-based thermal interface structure deployed between an IC chip and heat spreader lid, as known in the art.
Figure 1B:
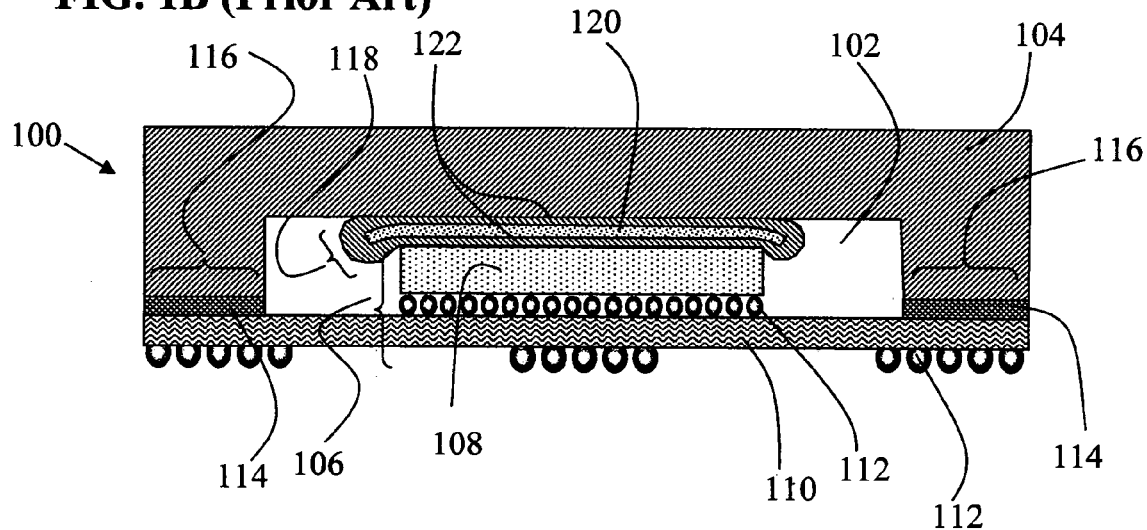
Figure 1C:
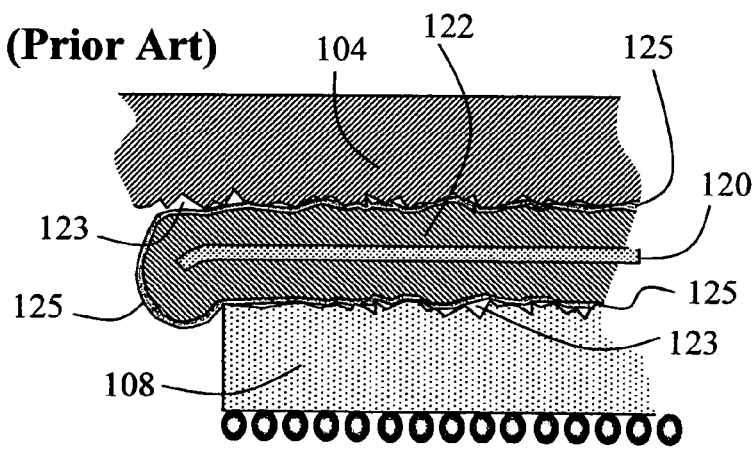
Figure 2:
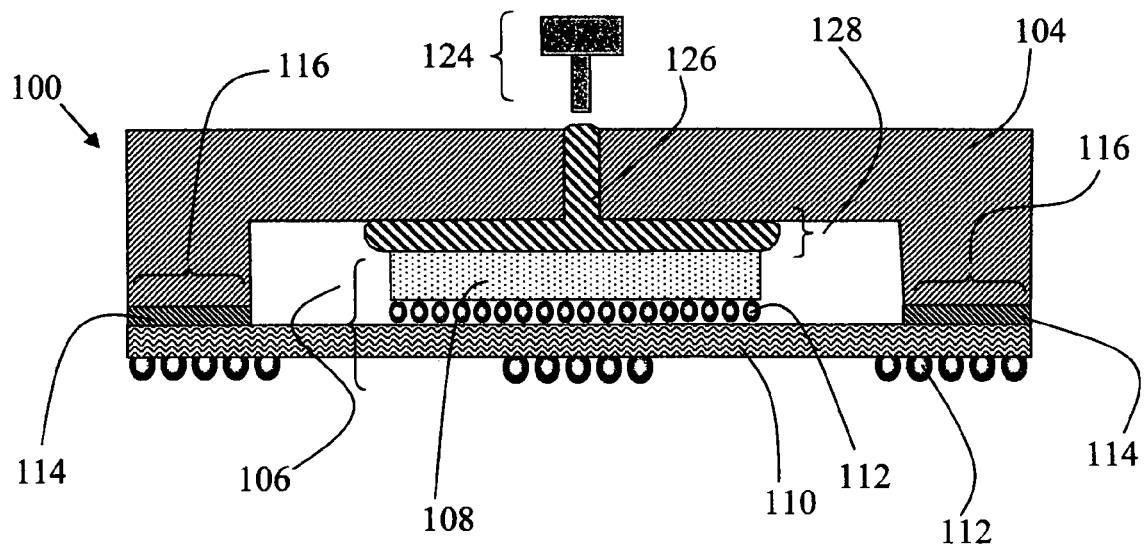
FIG. 2, a sectional view, illustrates an electronic assembly in which thermal interface material is injected through a hole in the heat spreader lid, as known in the art.
Figure 3:
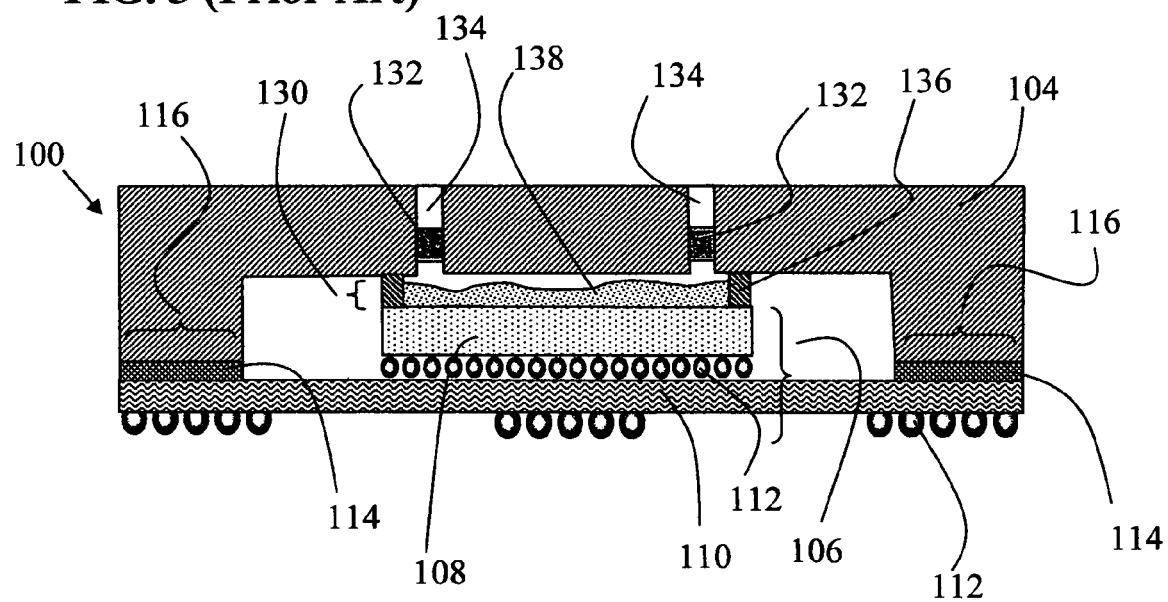
FIG. 3, a sectional view, illustrates an electronic assembly in which thermal interface material is added though a vent to fill the space inside of a barrier formed between the IC chip and lid, as known in the art.

Described below are several embodiments of the present invention which illustrate various ways the present invention can be implemented. In the descriptions that follow, like numerals represent like numerals in all figures. For example, where the numeral 100 is used to refer to a particular element in one figure, the numeral 100 appearing in any other figure refers to the same element.

FIGS. 4a through 4d illustrate a sequence of the present invention in which the thermal interface structure 140 flows and fills the space between the electronic component and heat exchanger to yield a highly conductive and hermetic thermal interface joint. An electronic assembly 100 includes a heat exchanger 104 (depicted as a heat spreader lid), a thermal interface structure 140 positioned between the lid 104 and an electronic component 106. The component 106 is comprised of an IC chip 108, package substrate 110 and electrical interconnection vias 112.

Figures 4A, 4B, 4C, 4D:
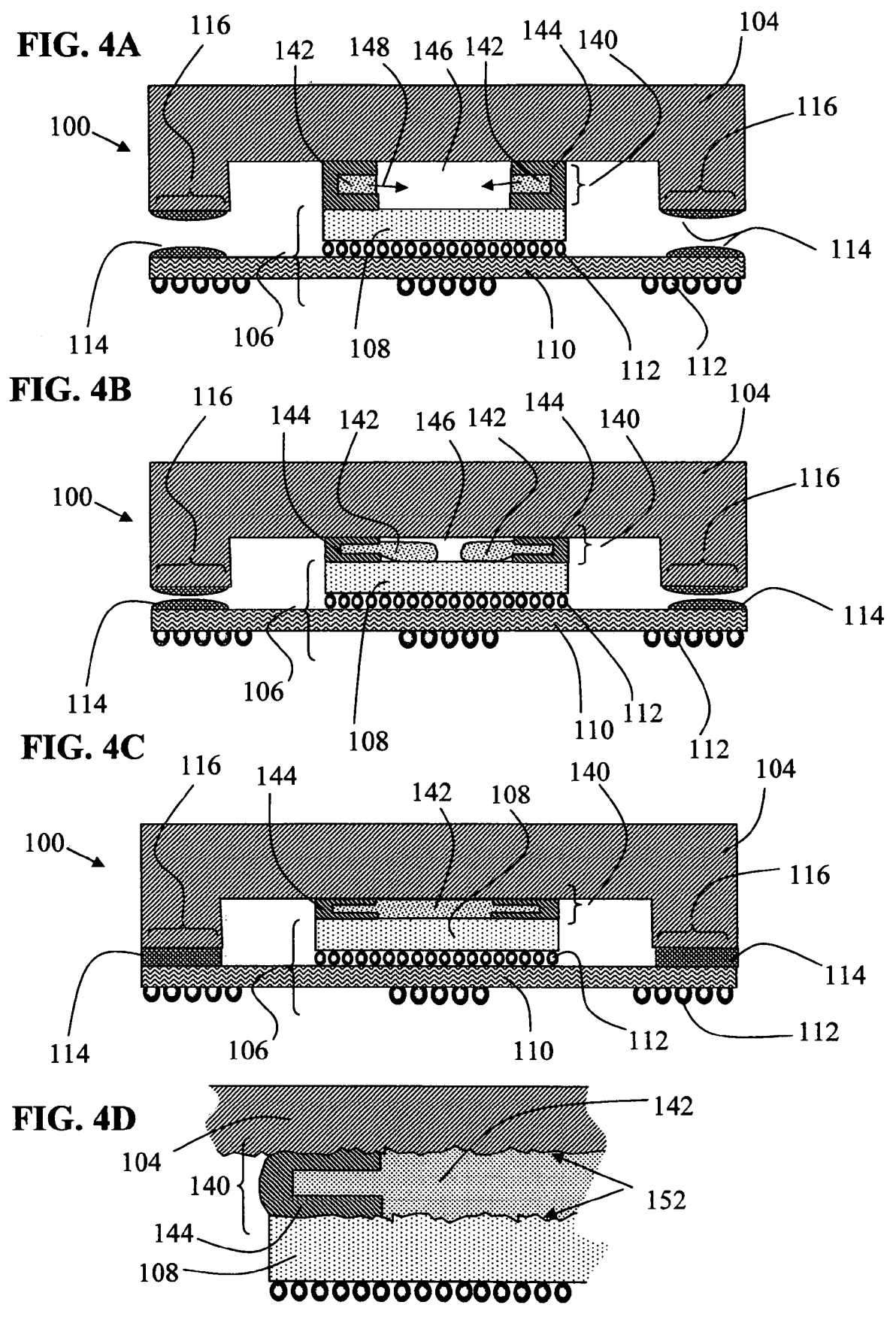

Within FIG. 4a, a thermal interface structure 140 includes a metallic seal member 142 (comprised of an inner and outer perimeter) which is positioned near the perimeter of the IC chip 108 and is comprised of a metallic interface composition. A coating layer 144 encapsulates the metallic seal member on all faces with the exception of the inner perimeter of the member 142. The coating layer 144 may be of metallic or polymeric composition. The interface structure 140, when disposed between the lid 104 and IC chip 108, creates an interface space 146 between the electronic component and heat spreader and a seal to each of their respective surfaces. With the application of heat (from the electronic component 106 or external source), the metallic seal member 142 will flow (flow arrows 148) into the space 146 and fill all the surface asperities of both heat spreader lid and IC chip.

FIG. 4b illustrates the melting and flowing of the metallic interface composition comprising the metallic seal member 142. Pressure applied external to the lid 104 or the weight of the heat exchanger 104 also promotes the flowing of the melting metallic seal member 142 and filling of the interface space 146. As the seal member 142 continues to melt, the space 146 between the lid 104 and IC chip 108 is reduced in volume.

As seen in FIG. 4c, the interface space 146 between the lid 104 and IC chip 108 has been fully filled with the metallic interface composition, comprising the metallic seal member 142. The coating layer 144 assists in containing the flowing interface composition within the perimeter of the metallic seal member 142. Due to the collapse of the metallic seal member 142 during melting, the adhesive layer 114, applied to the heat spreader lid 104 at the outer lid flange 116 and package substrate 110, is now bonded to the electronic component package substrate 110. Seal materials include silicones, polysulphides, polyurethanes, polyimides, polyesters, epoxides, cyanate esters, olefins and sealing glasses. A continuous seal between the heat spreader lid flange 116 and package substrate 110 greatly reduces the amount of moisture ingression within the lid cavity, resulting in reduced film formation and corrosion on the thermal interface structure 140.

FIG. 4d, a magnified view of FIGS. 4a through 4c, illustrates the filling of surface asperities 152 present on the IC chip 108 and heat spreader lid 104.

The metallic interface composition (comprising the metallic seal member 142) may be comprised of the metallic elements of bismuth, gallium, indium and tin and their alloys.

It is desirable for the composition to be liquid over the operating temperature of the electronic component. This allows the metal to adequately flow into all surface asperities of the heat spreader lid 104 and IC chip 108.

In another embodiment of the present invention, "reactive" elements or intrinsic oxygen gettering elements are added to the metallic interface composition to further facilitate wetting to the lid 104 and IC chip 108. The resulting composition has a higher affinity for surface oxides and promotes oxide to oxide bonding, thereby reducing the thermal impedance at the lid 104 and chip 108 contact interfaces. Oxygen getter elements include alkali metals (Li, Na, and K), alkaline-earth metals (Mg and Ca), zinc, refractory metals (Ti, Zr, Hf, Ta, V, and Nb), rare earth metals (La, Ce, Pr, Nd, Sm, Eu, Gd, Tb, Dy and Yb), and mixtures and alloys thereof.

Figure 5A:
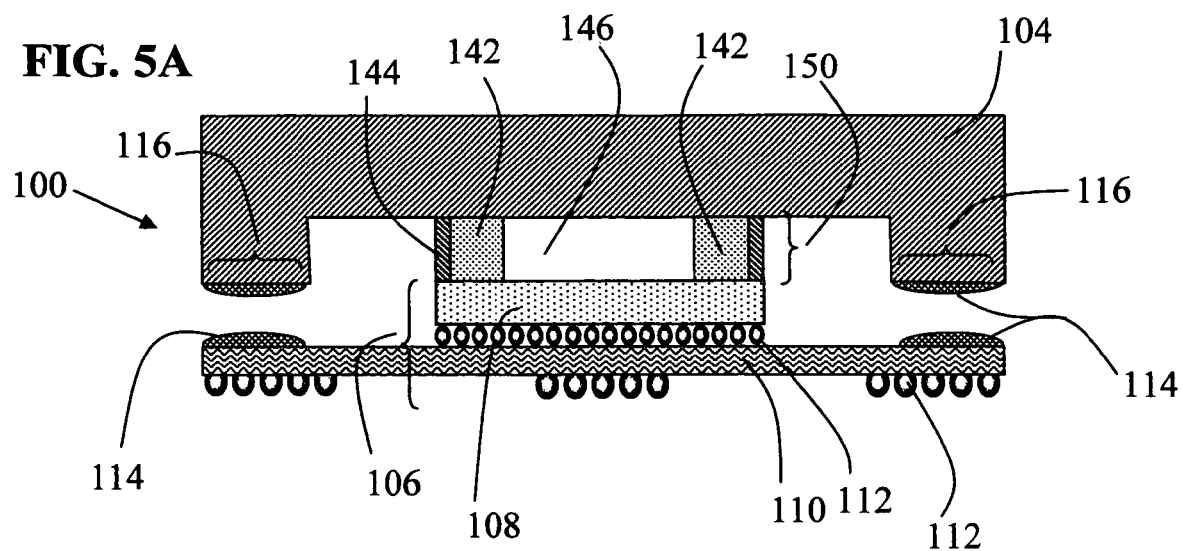
FIGS. 5a and 5b, sectional views, illustrate another sealing embodiment of the present invention.
Figure 5B:
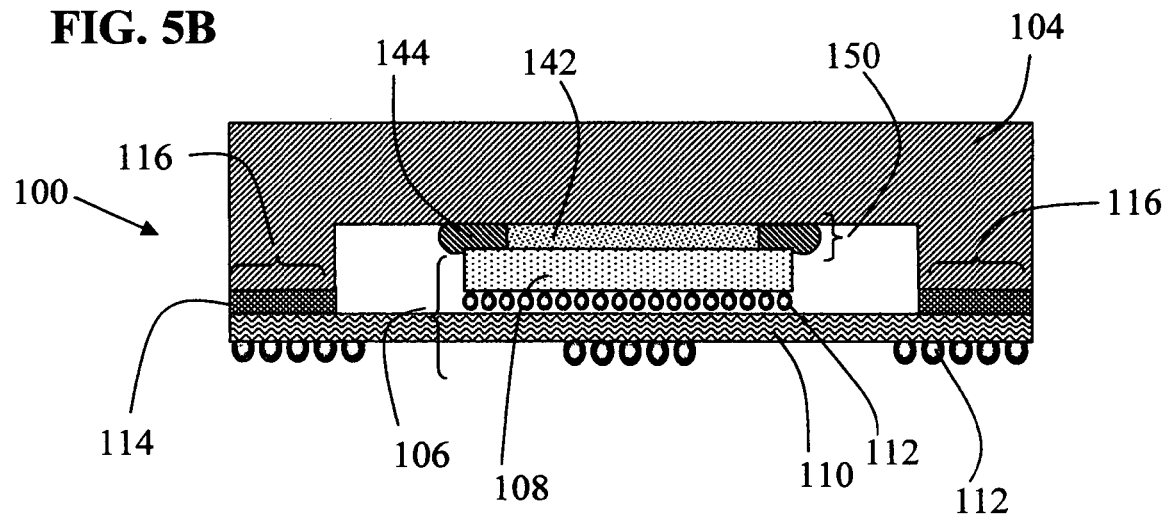

Within FIGS. 5a and 5b, another thermal interface structure of the present invention is illustrated as a sequence of interface formation.

FIG. 5a, a similar electronic assembly structure 100 to FIGS. 4a-4c, includes a thermal interface structure 150 comprised of a metallic seal member 142 (comprised of a metallic interface composition) with an inner and outer perimeter. A coating layer 144 is shown surrounding the outer perimeter of the metallic seal member 142.

FIG. 5b illustrates the fully flowed thermal interface structure 150 in which the interface space 146 between the IC chip 108 and lid 104 has been filled with the metallic interface composition comprising the metallic seal member 142.

Figure 6A:
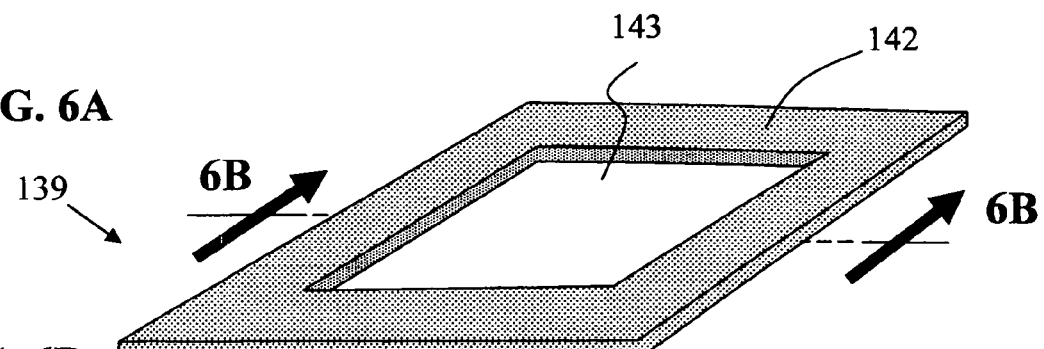
FIGS. 6a and 6b, an isometric and sectional view, respectively, illustrate a metallic interface composition formed as a metallic seal in the present invention.
Figure 6B:

FIGS. 6A (an isometric view) and 6B (a sectional view of FIG. 6a on lines 6B-6B) illustrate a thermal interface structure 139 comprised of a metallic seal member 142 (comprised of a metallic interface composition) and inner perimeter 143 (and therefore outer perimeter) seen in FIGS. 4a through 4c and FIGS. 5a and 5b.

Figure 7A:
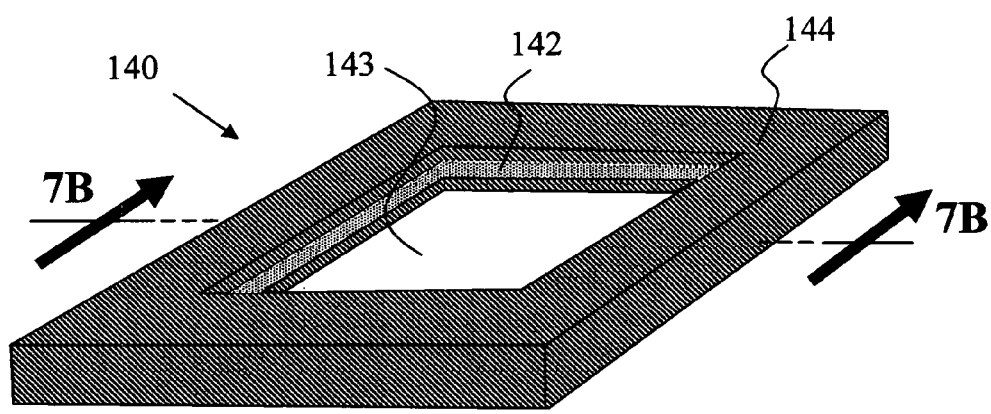
FIGS. 7a and 7b, an isometric and sectional view, respectively, illustrate a coating layer encapsulating the metallic interface composition in all faces with the exception of the inner perimeter within the present invention.

The thermal interface structure 140 of FIGS. 7A (an isometric view) and 7B (a sectional view of FIG. 7a on lines 7B-7B) includes a metallic seal member 142 and inner perimeter 143; however, a coating layer 144 encapsulates all surfaces of the metallic seal member with the exception of the inner perimeter 143.

Figure 7B:
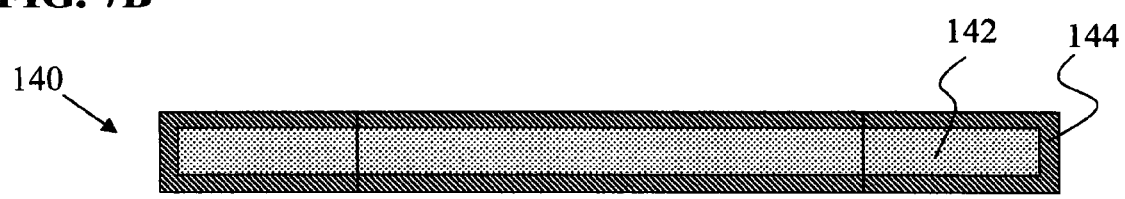
Figure 8:
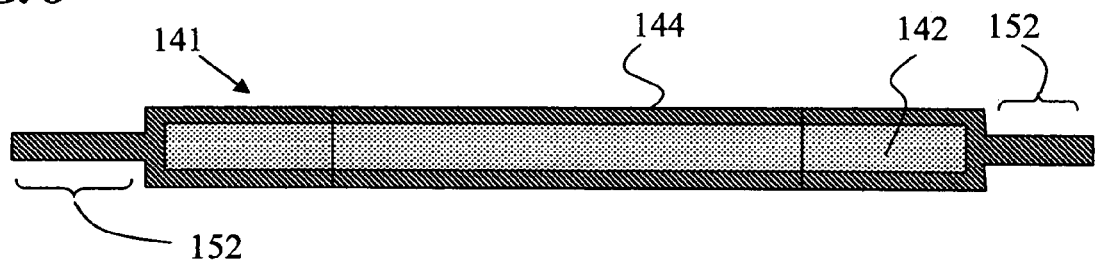
FIG. 8, a sectional view, illustrates another embodiment of the present invention in which the coating layer forms a border around the metallic seal outer perimeter.

Similar to FIGS. 7A and 7B, the thermal interface structure 141 of FIG. 8 includes a coating layer 144 which extends a distance from the outer perimeter of the metallic seal member 142, thereby forming a boundary region 152 which facilitates adhesive attachment to a variety of heat exchangers.

Figure 9A:
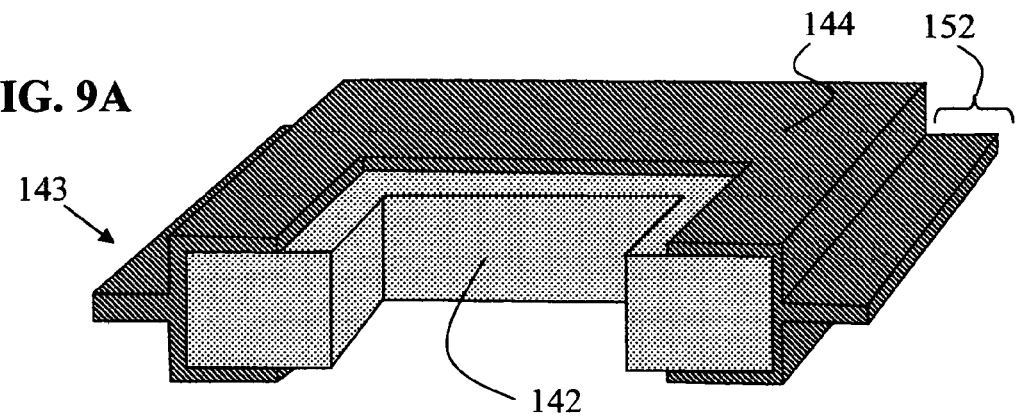
FIGS. 9A and 9B, an isometric and sectional view, respectively, illustrate the coating layers partially encapsulating the top and bottom faces of the metallic seal.
Figure 9B:
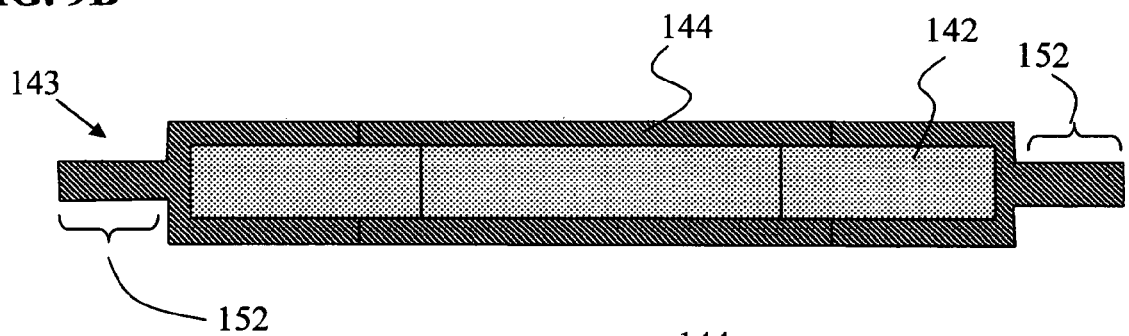

As seen in FIG. 9A (a sectioned isometric view) and FIG. 9B (a side view), the thermal interface structure 143 includes coating layers 144 which partially encapsulate the top and bottom faces of the metallic seal member 142. This increases the volume of the metallic interface composition without increasing the surface area contact between the coating layer 144 and the IC chip 108 and heat spreader lid 104.

Figure 10A:
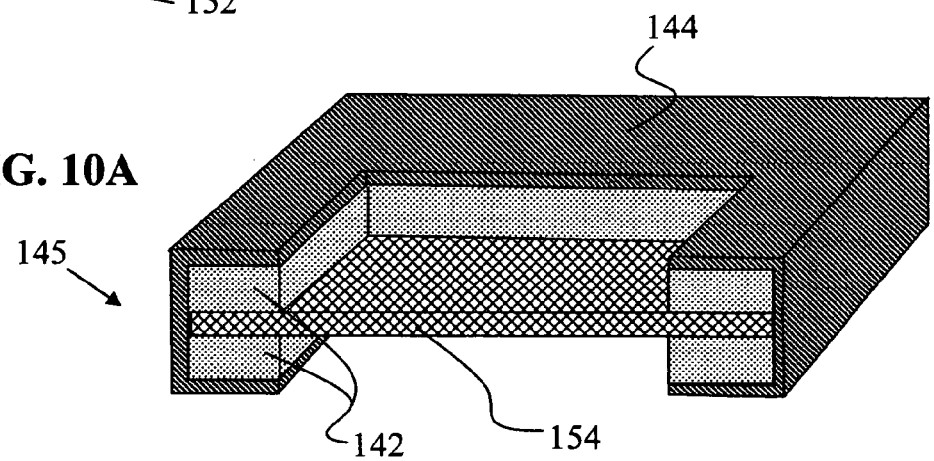
FIGS. 10A and 10B, an isometric and sectional view, respectively, illustrate another embodiment of the present invention including a solid metallic core disposed within the metallic interface composition.
Figure 10B:
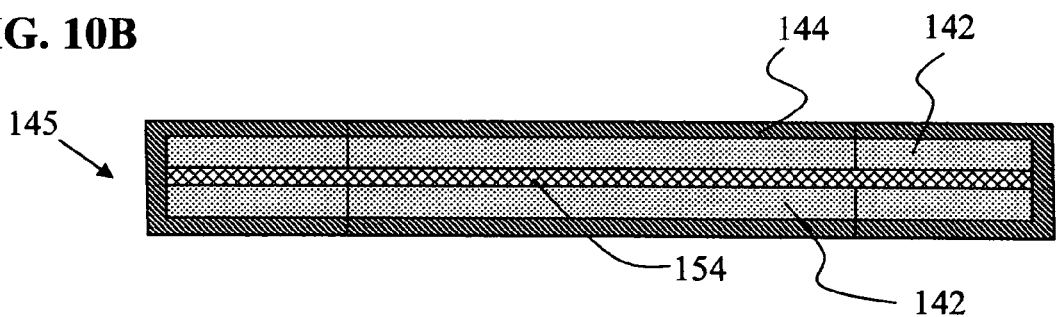

Within FIG. 10A (a sectioned isometric view) and FIG. 10B (a side view), the thermal interface structure 145 includes a solid metallic core 154 which is disposed within the metallic interface composition, comprising the metallic seal member 142. The metallic core 154 includes two faces wherein the metallic interface composition (comprising the metallic seal member 142) flows onto at least one face of the solid metallic core 154 when the metallic seal member 142 is melted. The core 154 may be comprised of a high conductivity metal or metal alloy such as copper or aluminum. In another embodiment, the metallic core 154 is comprised of at least one metallic element comprising the metallic interface composition such as indium, tin or bismuth.

FIG. 11, similar to FIG. 10B, illustrates another thermal interface structure embodiment 147 wherein the metallic core 154 and coating layer 144 extend a distance from the outer perimeter of the metallic seal member 142, thereby forming a boundary region 152 which facilitates bonding of the individual coating layers as well as adhesive attachment to a variety of heat exchangers.

As seen in FIG. 12, a thermal interface structure 149 (similar to FIG. 11) is illustrated wherein the solid metallic core 154 includes a diffusion barrier layer 156 and wetting layer 158 (over the diffusion barrier layer). In one embodiment of the present invention, the metallic interface composition (comprising the metallic seal member 142) is applied to the solid metallic core 154 prior to melting of the metallic seal member 142 in order to further facilitate wetting and flowing of the metallic interface composition on the core 154.

Now, within FIG. 13, metallic interface composition "islands" 160 (disposed onto each face of the metallic core 154) are included with the thermal interface structure 151 also seen in FIG. 10A. The islands 160 are comprised of both the metallic interface composition (comprising the metallic seal layer 142) and coating layer 144 positioned near the perimeter of the interface structure 151. Similarly, the islands' interface composition will melt and flow into the space between a heat exchanger and IC chip, thereby providing additional interface material for filling the space.

Figure 14:
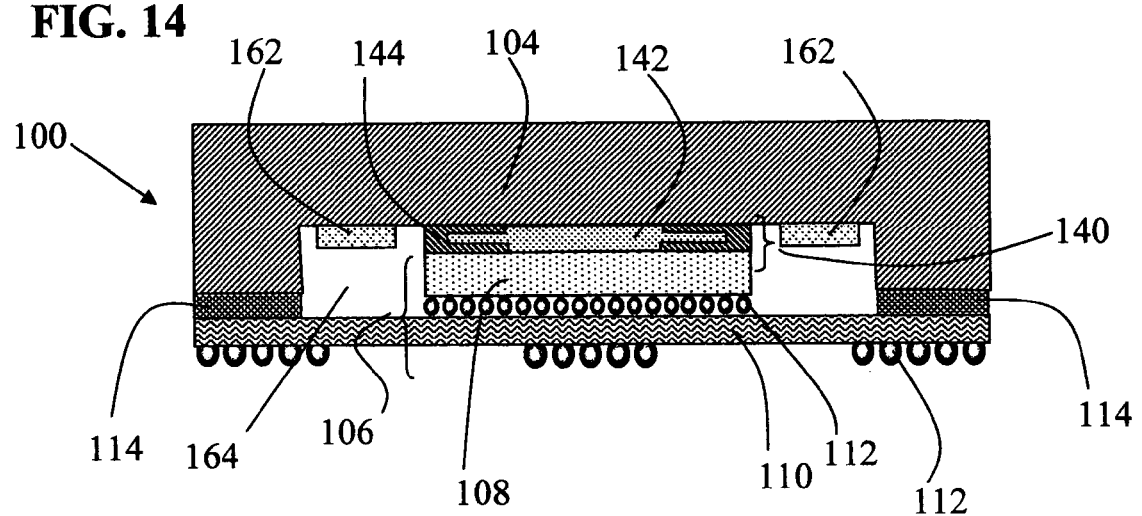
FIG. 14, a sectional view, illustrates an electronic assembly, including one interface material structure embodiment of the present invention, in which the cavity of the heat spreader lid includes a corrosion inhibiting structure.

FIG. 14 illustrates a corrosion inhibiting material 162, such as a moisture desiccant, vapor phase or liquid phase corrosion inhibitor, is disposed within the heat spreader lid cavity 164. These materials, in powder or granular form, may be first applied to an absorbent or adhesive substrate/medium to facilitate deployment within the lid cavity 164.

Moisture desiccants can adsorb significant amounts of water even at low humidity levels. The reduction of humidity within the lid cavity 164 results in greatly reduced corrosion rates on the thermal interface structure 140.

Vapor phase corrosion inhibitors are compounds transported in a closed environment to the site of corrosion by volatilization from a source. The vapors protect metallic surfaces through the deposition or condensation of a protective film or coating. Upon contact with the thermal interface structure 140, the vapor of these salts condenses and is hydrolyzed by any moisture to liberate protective ions, thus mitigating any corrosion.

Figure 15:
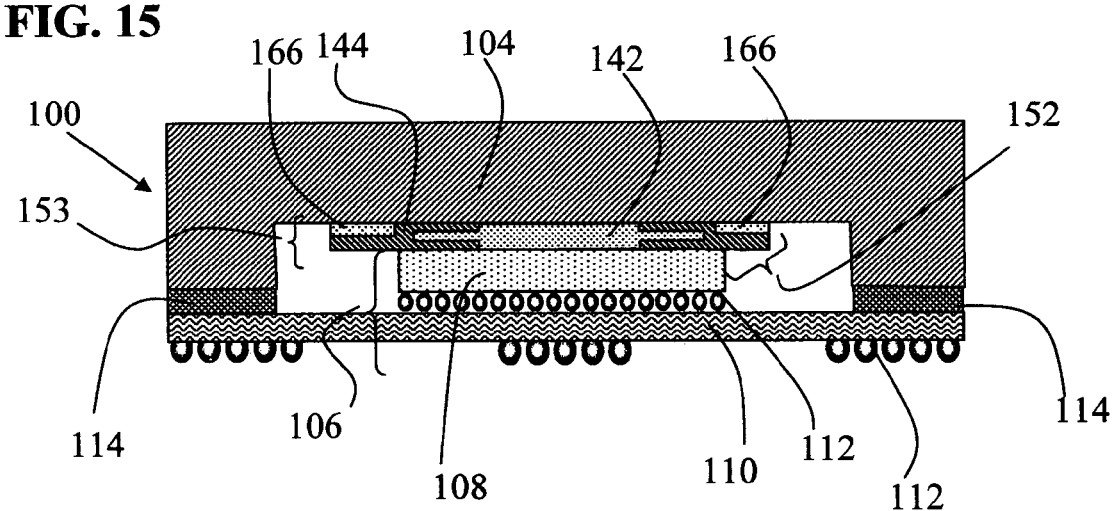
FIG. 15, a sectional view, illustrates one interface material structure embodiment of the present invention adhesively attached to the heat spreader lid.

As seen in FIG. 15, another thermal interface structure embodiment 153 of the present invention, a boundary region 152, located outside of the outer perimeter of the metallic seal (illustrated as the space 146), includes an adhesive layer 166 which facilitates attachment of the interface structure 153 to the heat exchanger (lid 104).

Figure 16:
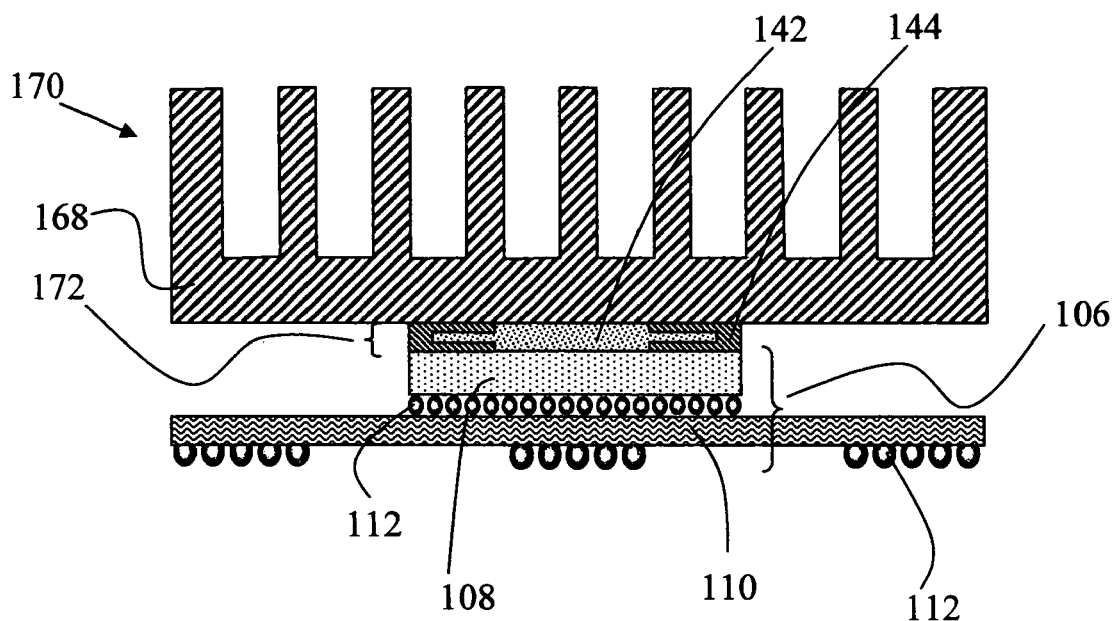
FIG. 16, a sectional view, illustrates one interface material structure embodiment of the present invention between an IC chip and heat sink.

FIG. 16 illustrates an electronic assembly 170 including an electronic component 106 (comprised of an IC chip 108, package substrate 110, and electrical interconnection vias 112), heat exchanger (heat sink) 168, and thermal interface structure 172. As another embodiment of FIGS. 4A through 4D, FIG. 16 illustrates the thermal interface structure 172 after the metallic seal member 142 has melted and flowed into the space 146 (seen in FIG.4A) between the heat exchanger 168 and chip 108.

Figure 17:
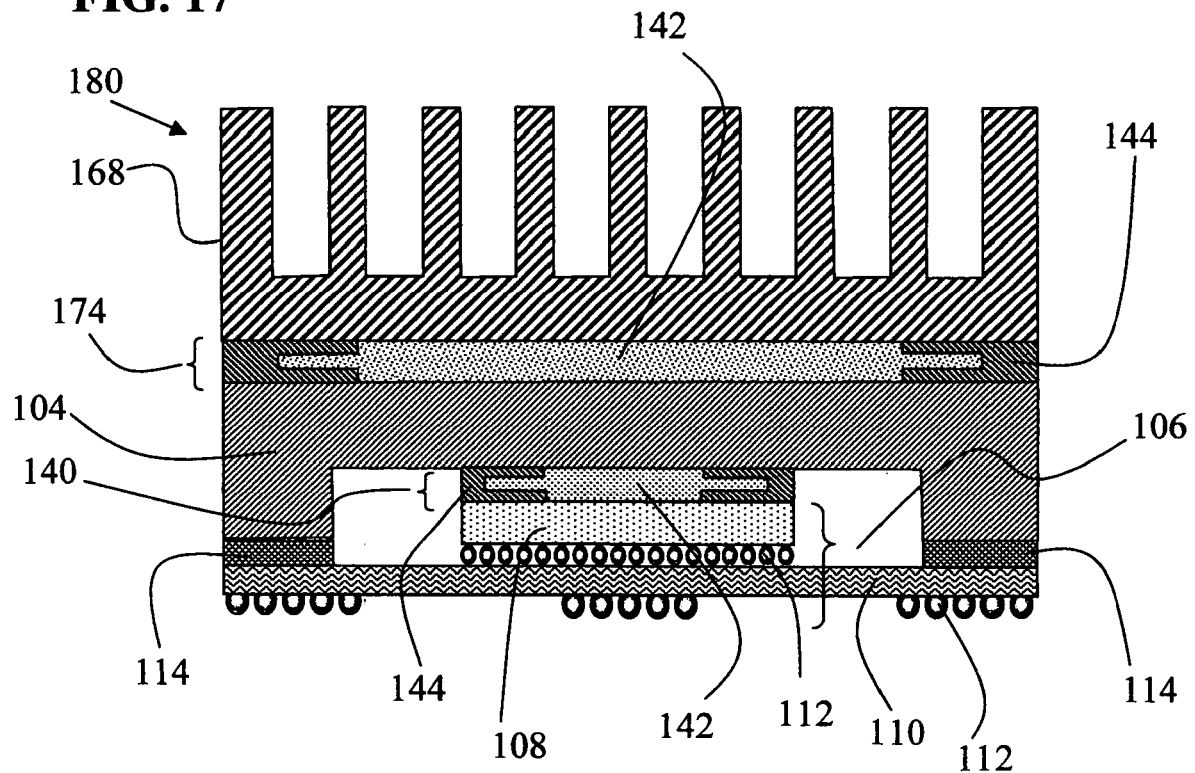
FIG. 17, a sectional view, illustrates one interface material structure embodiment of the present invention positioned between an IC chip and heat spreader lid and between the lid and heat sink.

Within FIG. 17, it can be seen that the electronic assembly 180 includes two heat exchangers, a heat spreader lid 104 (with a thermal interface structure 140 between the lid 104 and IC chip 108) and a heat sink 168 with a thermal interface structure 174 between both heat exchangers. The resultant electronic assembly, providing an all metal heat path from the IC chip 108 and heat sink 168, would possess high thermal performance with a high degree of reliability and ease of deployment.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

The invention claimed is:

1. An electronic assembly including an electronic component, heat exchanger, and thermal interface structure comprised of a metallic interface composition, the assembly comprising:
   (a) a metallic interface composition disposed between the electronic component and heat exchanger, said metallic interface composition is positioned near the periphery of the electronic component thereby forming a washer shaped metallic seal member, and said seal member including an inner perimeter surrounding a space devoid of metallic interface composition; and
   (b) the metallic seal is flowed, thereby filling surface asperities and the interfacial space, said space defining the metallic seal inner perimeter.

2. The assembly in claim 1 wherein the metallic seal member is encapsulated on all sides with the exception of the inner perimeter.

3. The assembly in claim 1 wherein a solid metallic core, including two faces, comprised of a high conductivity metal is disposed between the electronic component and heat exchanger and the metallic interface composition is flowed onto at least one face of the solid metallic core thereby filling surface asperities.

4. The assembly in claim 1 wherein the metallic interface composition includes an intrinsic oxygen getter selected from the group consisting of rare earth metals, alkali metals, alkaline-earth metals, refractory metals, and mixtures and alloys thereof.

5. The assembly in claim 1 wherein the metallic interface composition is liquid at the operating temperature range of the electronic component.

6. A thermal interface structure for transferring heat from an electronic component to a heat exchanger, the structure comprising:
   (a) a metallic interface composition disposed between the electronic component and heat exchanger, said metallic interface composition is positioned near the periphery of the electronic component thereby forming a washer shaped metallic seal member, and said seal member including an inner perimeter surrounding a space devoid of metallic interface composition; and
   (b) the metallic seal is flowed, thereby filling surface asperities and the interfacial space, said space defining the metallic seal inner perimeter.

7. The structure in claim 6 wherein the metallic seal member is encapsulated on all sides with the exception of the inner perimeter.

8. The structure in claim 6 wherein a solid metallic core, including two faces, comprised of a high conductivity metal is disposed between the electronic component and heat exchanger.

9. The structure in claim 6 wherein the metallic interface composition is flowed onto at least one face of the solid metallic core thereby filling surface asperities.

10. The structure in claim 8 wherein the solid metallic core includes a diffusion barrier layer.

11. The structure in claim 8 wherein the solid metallic core is comprised of a metallic interface composition wetting layer over the diffusion barrier layer.

12. The structure in claim 6 wherein the metallic interface composition is applied to the solid metallic core prior to melting of the metallic seal.

13. The structure in claim 6 wherein the heat exchanger is a heat spreader lid, said lid having an underside which includes a cavity and an outer flange.

14. The structure in claim 6 wherein the electronic component includes a substrate.

15. The structure in claim 14 wherein a continuous seal is formed between the heat spreader lid outer flange and electronic component substrate.

16. The structure in claim 13 wherein at least one corrosion inhibiting material disposed within the heat spreader lid cavity.

17. The structure in claim 16 wherein the corrosion inhibiting material is a moisture desiccant.

18. The structure in claim 16 wherein the corrosion inhibiting material is a vapor phase corrosion inhibitor.

19. The structure in claim 6 wherein the metallic interface composition includes an intrinsic oxygen getter selected from the group consisting of rare earth metals, alkali metals, alkaline-earth metals, refractory metals, and mixtures and alloys thereof 20. The structure in claim 6 wherein the metallic interface composition is liquid at the operating temperature range of the electronic component.

21. A thermal interface structure for transferring heat from an electronic component to a heat exchanger, the structure comprising:
   (a) a metallic interface composition disposed between the electronic component and heat exchanger, said metallic interface composition is positioned near the periphery of the electronic component thereby forming a washer shaped metallic seal member, and said seal member including an inner and outer perimeter, said inner perimeter surrounding a space devoid of metallic interface composition;
   (b) the metallic seal is flowed, thereby filling surface asperities and the interfacial space, said space defining the metallic seal inner perimeter; and
   (c) a coating layer surrounding the outer perimeter of the metallic seal member.

22. The structure in claim 21 wherein the metallic seal member is encapsulated on all sides with the exception of the inner perimeter.

23. The structure in claim 21 wherein the coating layer is metallic.

24. The structure in claim 21 wherein a solid metallic core, including two faces, comprised of a high conductivity metal is disposed between the electronic component and heat exchanger and the metallic interface composition is flowed onto at least one face of the solid metallic core thereby filling surface asperities.

25. The structure in claim 24 wherein the solid metallic core includes a diffusion barrier layer.

26. The structure in claim 24 wherein the solid metallic core is comprised of a metallic interface composition wetting layer over the diffusion barrier layer.

27. The structure in claim 21 wherein the metallic interface composition is applied to the solid metallic core prior to melting of the metallic seal.

28. The structure in claim 21 wherein the heat exchanger is a heat spreader lid, said lid having an underside which includes a cavity and an outer flange.

29. The structure in claim 21 wherein the electronic component includes a substrate.

30. The structure in claim 29 wherein a continuous seal is formed between the heat spreader lid outer flange and electronic component substrate.

31. The structure in claim 28 wherein at least one corrosion inhibiting material disposed within the heat spreader lid cavity.

32. The structure in claim 31 wherein the corrosion inhibiting material is a moisture desiccant.

33. The structure in claim 31 wherein the corrosion inhibiting material is a vapor phase corrosion inhibitor.

34. The structure in claim 21 wherein the metallic interface composition includes an intrinsic oxygen getter selected from the group consisting of rare earth metals, alkali metals, alkaline-earth metals, refractory metals, and mixtures and alloys thereof 35. The structure in claim 21 wherein the metallic interface composition is liquid at the operating temperature range of the electronic component.

36. A thermal interface structure for transferring heat from an electronic component to a heat exchanger, the structure comprising:
   (a) a metallic interface composition disposed between the electronic component and heat exchanger, said metallic interface composition is positioned near the periphery of the electronic component thereby forming a washer shaped metallic seal member, and said seal member including an inner and outer perimeter, said inner perimeter surrounding a space devoid of metallic interface composition and said metallic seal member encapsulated on all sides with the exception of the inner perimeter; and
   (b) the metallic seal is flowed, thereby filling surface asperities and the interfacial space, said space defining the metallic seal inner perimeter.

37. The structure in claim 36 wherein a solid metallic core, including two faces, comprised of a high conductivity metal is disposed between the electronic component and heat exchanger and the metallic interface composition is flowed onto at least one face of the solid metallic core thereby filling surface asperities.

38. The structure in claim 36 wherein the metallic seal member is encapsulated by a metallic coating layer.

39. The structure in claim 37 wherein the solid metallic core includes a diffusion barrier layer.

40. The structure in claim 39 wherein the solid metallic core is comprised of a metallic interface composition welling layer over the diffusion barrier layer.

41. The structure in claim 36 wherein the metallic interface composition is applied to the solid metallic core prior to melting of the metallic seal.

42. The structure in claim 36 wherein the heat exchanger is a heat spreader lid, said lid having an underside which includes a cavity and an outer flange.

43. The structure in claim 36 wherein the electronic component includes a substrate.

44. The structure in claim 43 wherein a continuous seal is formed between the heat spreader lid outer flange and electronic component substrate.

45. The structure in claim 42 wherein at least one corrosion inhibiting material disposed within the heat spreader lid cavity.

46. The structure in claim 45 wherein the corrosion inhibiting material is a moisture desiccant.

47. The structure in claim 45 wherein the corrosion inhibiting material is a vapor phase corrosion inhibitor.

48. The structure in claim 36 wherein the metallic interface composition includes an intrinsic oxygen getter selected from the group consisting of rare earth metals, alkali metals, alkaline-earth metals, refractory metals, and mixtures and alloys thereof.

49. The structure in claim 36 wherein the metallic interface composition is liquid at the operating temperature range of the electronic component.

50. A thermal interface structure for transferring heat from an electronic component to a heat exchanger, the structure comprising:
   (a) a metallic interface composition disposed between the electronic component and heat exchanger, said metallic interface composition is positioned near the periphery of the electronic component thereby forming a washer shaped metallic seal member, and said seal member including an inner perimeter surrounding a space devoid of metallic interface composition;
   (b) a solid metallic core, including two faces, comprised of a high conductivity metal, disposed between the electronic component and heat exchanger; and
   (c) the metallic seal is flowed, thereby flowing onto at least one face of the solid metal core, filling surface asperities and the interfacial space, said space defining the metallic seal inner perimeter.

51. The structure in claim 50 wherein the metallic seal member is encapsulated on all sides with the exception of the inner perimeter.

52. The structure in claim 50 wherein the metallic seal member is encapsulated by a metallic coating layer.

53. The structure in claim 52 wherein the coating layer extends a distance from the outer perimeter of the metallic seal.

54. The structure in claim 50 wherein the solid metallic core is formed of at least one metallic element comprising the metallic interface composition.

55. The structure in claim 50 wherein the solid metallic core includes a diffusion barrier layer.

56. The structure in claim 55 wherein the solid metallic core is comprised of a metallic interface composition wetting layer over the diffusion barrier layer.

57. The structure in claim 50 wherein the metallic interface composition is applied to the solid metallic core prior to melting of the metallic seal.

58. The structure in claim 50 wherein the heat exchanger is a heat spreader lid, said lid having an underside which includes a cavity and an outer flange.

59. The structure in claim 50 wherein the electronic component includes a substrate.

60. The structure in claim 59 wherein a continuous seal is formed between the heat spreader lid outer flange and electronic component substrate.

61. The structure in claim 58 wherein at least one corrosion inhibiting material disposed within the heat spreader lid cavity.

62. The structure in claim 61 wherein the corrosion inhibiting material is a moisture desiccant.

63. The structure in claim 61 wherein the corrosion inhibiting material is a vapor phase corrosion inhibitor.

64. The structure in claim 50 wherein the metallic interface composition includes an intrinsic oxygen getter selected from the group consisting of rare earth metals, alkali metals, alkaline-earth metals, refractory metals, and mixtures and alloys thereof.

65. The structure in claim 50 wherein the metallic interface composition is liquid at the operating temperature range of the electronic component.

66. A method of manufacturing an electronic assembly including at least one IC chip comprising an electronic component, at least one heat exchanger and at least one thermal interface structure, comprised of a metallic interface composition formed as a seal member including an inner and outer perimeter, the method comprising:
  (a) forming a sandwich comprised of the electronic component, heat exchanger and thermal interface structure wherein the metallic interface composition is disposed between the electronic component and heat exchanger, said metallic interface composition positioned near the periphery of the electronic component thereby forming a washer shaped metallic seal member, and the seal member includes an inner perimeter surrounding a space devoid of metallic interface composition; and
  (b) heating the thermal interface structure causing the metallic seal member to flow and fill surface asperities and the interfacial space, the space defining the metallic seal member inner perimeter.

67. The method of claim 66 wherein the metallic seal member is encapsulated on all sides with the exception of the inner perimeter.

68. The method of claim 66 wherein a solid metallic core, including two faces, comprised of a high conductivity metal is disposed between the electronic component and heat exchanger and the metallic interface composition is flowed onto at least one face of the solid metallic core thereby filling surface asperities.

69. The method of claim 68 wherein the metallic interface composition is applied to the solid metallic core prior to melting of the metallic seal.

70. The method of claim 66 wherein the metallic interface composition includes an intrinsic oxygen getter selected from the group consisting of rare earth metals, alkali metals, alkaline-earth metals, refractory metals, and mixtures and alloys thereof 71. The method of claim 66 wherein the metallic interface composition is liquid at the operating temperature range of the electronic component.

72. The method of claim 66 wherein the metallic interface composition does not extend beyond the periphery of the electronic component.

\* \* \* \* \*